United States Patent [19]

Metz

[11] 4,408,180

[45] Oct. 4, 1983

[54] TRAFFIC SIGNAL LIGHT INTENSITY CONTROL

[76] Inventor: Ramey B. Metz, 18605 S. Mesa Dr., Villa Park, Calif. 92667

[21] Appl. No.: 208,989

[22] Filed: Nov. 21, 1980

Related U.S. Application Data

[63] Continuation-in-part of Ser. No. 184,966, Sep. 8, 1980, abandoned.

[51] Int. Cl.³ .......................... G08G 1/00; H05B 37/02; H03K 19/14

[52] U.S. Cl. .......................................................... 340/40

[58] Field of Search ............... 340/40, 41 R; 455/343; 307/296 A; 364/707

[56] References Cited

U.S. PATENT DOCUMENTS 3,500,455 3/1970 Ross et al. ............................ 340/40

3,787,752 1/1974 Delay ............................ 307/296 A

*Primary Examiner*—T. A. Robinson

[57] ABSTRACT

A circuit capable of reducing power consumed by all of the signal lights at a street intersection is presented. The circuit comprises activating switching means which activate the circuit. The circuit further includes timing current interruption means which are turned on by the activating means. The timing current interruption means inhibit the 24 volt, low voltage supply to the load switches of the selected signal lights thereby preventing the power normally supplied to the signal lights from being supplied to the signal lights while the low voltage supply is inhibited. A preferred mode of operation inhibits alternate cycles of the AC power so that only 30 or every other of the 60 cycles of AC power normally transmitted to the traffic signal light each second are actually transmitted to the traffic signal light. This reduction in power is at such a high frequency that at night time or at other times when the power is to be reduced, a normal human eye will not detect any substantial change such as flickering in the traffic signal light, but will only perceive a reduced intensity. The activating switching means are turned on, under normal operation parameters at night when because of the absence of sunlight, the drivers can see the traffic signal lights at a reduced intensity. The intensity of the traffic signal lights can be reduced by half or any other desired ratio or percentage.

5 Claims, 2 Drawing Figures

TRAFFIC SIGNAL LIGHT INTENSITY CONTROL

The present application is a continuation in part of an application by the same inventor, Ser. No. 06/184/966, filed Sept. 8 1980 which has now been abandoned.

BACKGROUND OF THE INVENTION

1. Field of the Invention

The present invention relates to methods and systems for saving energy by reducing the intensity of traffic signal lights at selected times when less intensity is required.

2. Description of the Prior Art

The human eye adjusts its light receiving capabilities as a function of the light received by the eye and the angles in which the light is coming. In effect, during daytime hours, the opening into the eye is smaller and a greater amount of light is necessary in order to achieve the same relative effect. At night, or when there is less light, a comparatively smaller amount of light will have the same subjective effect. This capability of the human eye to open wider in dim light opens the way to save a substantial amount of energy. Among the ways that energy can be saved includes the reduction of the intensity of traffic signal lights during non-daylight hours. The power saving per intersection in major cities will average about 1,000 kilowatt hours per intersection (having a cost of perhaps $90.00) per year. Since there are about 100,000 appropriate intersections in the U.S., the saving would be probably substantially in excess of 100 million kilowattt hours per year.

The control at any one intersection could be by means of a light intensity tester or by timer or by a signal transmitted from a central point.

The prior art includes at least two types of dimmers. A model PC 110 manufactured by 3M Corporation U.S. Pat. No. 3,500,455 is approximately 1½ inches×¾ inches×2¾ inches and is potted with clear epoxy/polyurethane. It has a 110/130 vac 60 Hz 1.5 amp Tungsten rating. It is used to dim one signal manufactured by 3M and contains an electric eye.

The dimmer is a conventional phase shift device where power is reduced to the lamp by delaying the start of conduction on both positive and negative half cycles, depending on ambient light conditions. When it is very dark, the conduction angle is somewhat less than 90 degrees (it may be 30 degrees to 40 degrees). Unfortunately, this system has a bad feature in that it introduces a substantial amount of noise into the system. While a filter network in the module reduces the noise, it is very difficult to filter the 10 amp load allowed for each load switch. This technique is, accordingly, not feasible for an entire intersection.

McMorrow Eng Co has a dimmer built into their load switch model LS-12D. This dimmer feature is activated by connecting pin 4 to logic ground, thereby applying plus 24 VDC to an electomechanical relay. This relay in turn switches a bridge circuit feeding what appears to be a SCR driver/power triac combination. When the relay is energized, the power output to the lamp load is half-wave, (positive half-cycles only). This reduces power consumption approximately 50 percent but introduces a DC component on the power line. This causes substantial problems for the power company if the system is used extensively in an area. The positive half-cycle which is used by MEG during the dimmer mode was probably chosen so that it would enable older model NEMA conflict monitors to detect conflicts, since these old monitors worked only on the positive half-cycle of the power lines.

SUMMARY OF THE INVENTION

A circuit capable of reducing power consumed by all of the signal lights at a street intersection is presented. The circuit comprises activating switching means to activate the circuit. The activating switching means activate timing current interruption means which in turn inhibit the 24 volt low voltage supply to the load switches of the selected signal lights, thereby preventing the power normally supplied to the signal lights from being supplied to the signal lights while the 24 volt low voltage supply is inhibited.

By this means, every other cycle, for example, of a 60 cycle ac current could be inhibited so that the traffic signal light would only receive 30 cycles per second. Under normal night time conditions, the human eye would not detect any flickering or any other change in the traffic signal light other than a reduced intensity. The intensity can be reduced by 50 percent by inhibiting every other cycle of the ac, or it can be reduced by any other selected percentage, depending on the light intensity. One example of the invention includes a light detector which would gradually reduce the light in intensity to a selected minimum so that less energy would need to be transmitted to the signal lights on cloudy days when a lesser intensity of the lights would be just as visible as a greater intensity would be on a sunny day.

The intensity control comprises a switch which is coupled between the ac line and a zero volt detector. The zero volt detector is coupled to a current limiter which in turn is coupled to a phase shift network. The phase shift network and power are both coupled to an optical coupler, which in turn controls a flip flop which in turn controls a pass transistor. A missing pulse detector receives data from the pass transistor and resets the flip flop if it appears that a missing pulse has been detected. The transistor then turns on the 24 volt low voltage supply to the load switches of the selected signal lights. Such load switches are standard in prior art traffic signal lights. Turning off the load switches of the selected signal lights in turn switches off the power normally supplied to the signal lights so that the signal lights are not illuminated while the load switches are turned off. The circuit according to the present invention turns on and off the traffic signal lights at a very high rate of speed, thereby reducing the amount of power supplied to the traffic signal light without transients, use of only the positive or negative half of the ac wave, and other prior art selection problems which caused relatively severe problems when installed in traffic signal lights. Accordingly, a circuit as described is capable of reducing power consumed by all the signal lights at a street intersection. The circuit itself is controlled by activating switching means which may comprise at least one of the following:

a timer, a light intensity detector, or signals from signal means coupled to the timing current interruption means to selectively activate and deactivate the timing current interruption means.

Missing pulse detector means, in a first example, are coupled to the timing current interruption means to prevent the timing current interruption means from preventing power from being supplied to the signal lights during substantially all situations where at least one element of the timing current interruptions means has failed.

The timing current interruption means comprises an ac hot line coupled through a diode to the base of an npn transistor and through a second diode to the emitter of the transistor and to a capacitor. The discharge of the capacitor causes the transistor to conduct when the diodes are not conducting because the ac has gone through zero to the positive half cycle. The transistor conducts current through a light emitting diode in an optical coupler which causes a coupled npn transistor to saturate. Saturation of the npn transistor raises the voltage to the clock input of a flip flop thereby switching the output state of the flip flop. Switching the output state of the flip flop switches a pass transistor between conducting and nonconducting states.

Conduction of current through the light emitting diode causes the pass transistor to conduct on alternate cycles of the incoming 60 cycle ac voltage. When the pass transistor is not conducting, its collector cuts off the 24-volt power supply feeding at least one load swiitch which causes the load switch to cut off ac power to at least one traffic light thereby preventing illumination of the traffic light while the pass transistor is not conducting.

The missing pulse detector comprises a storage capacitor having a first plate coupled in series to a diode and resistor in parallel. The second plate of a capacitor is coupled to minus 24 volts dc through another capacitor and resistor in parallel. The junction of the capacitor, resistor and diode are coupled to the flip flop to reset the flip flop in the absence of a switch in state of the flip flop during the charging time of the capacitor. Resetting the flip flop allows conduction by the pass transistor which in turn prevents the inhibiting of the 24 volts so that the circuit also referred to as a dimmer is incapable of inhibiting power to the traffic signal lights while the flip flops reset. As used herein, resistor is the same as resistance.

DRAWING DESCRIPTION

Reference should be made at this time to the following detailed description which should be read in conjunction with the following drawings, of which:

FIG. 1 is a block diagram of a traffic signal light intensity control circuit according to the present invention; and FIG. 2 is a circuit diagram of the block diagram of FIG. 1.

DETAILED DESCRIPTION

Figure 1:
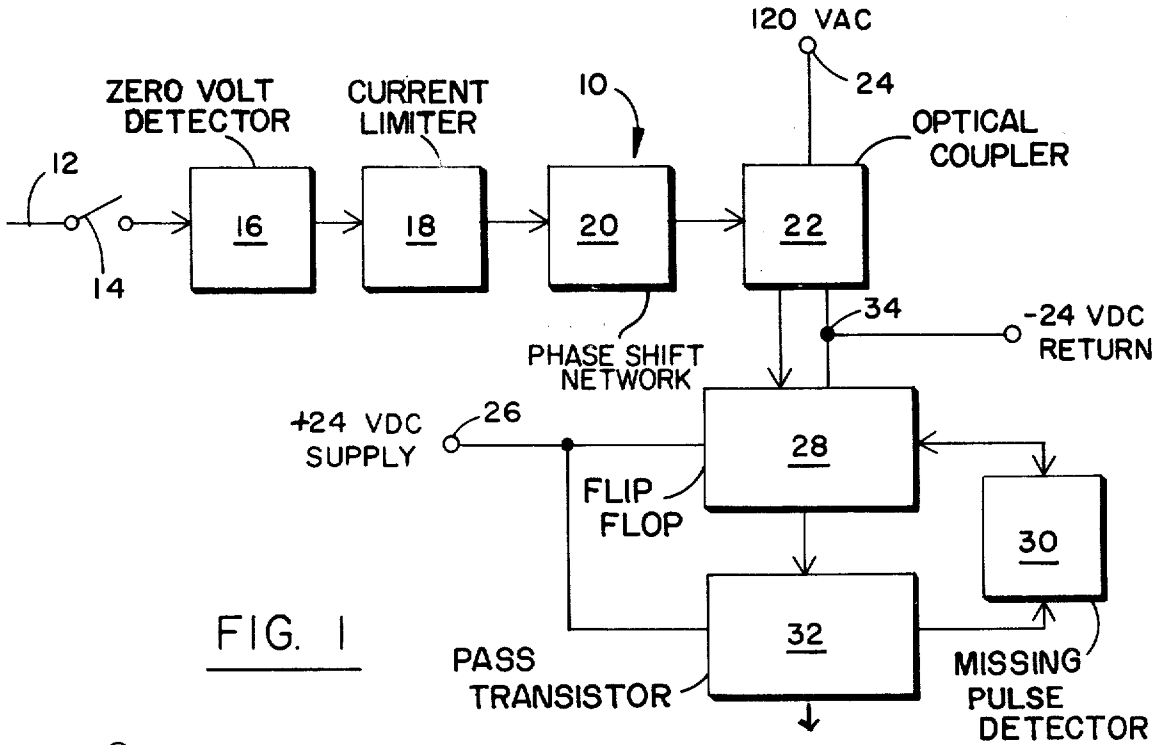

Reference should be made at this time to FIG. 1 which is a block diagram of a circuit 10 according to the present invention. An ac hotline 12 is coupled to an ac common switch 14 to a zero volt detector 16 which in turn controls a current limiter 18. The current limiter 18 in turn controls a phase shift network 20.

An optical coupler 22 is coupled to a 120 volt ac current at a terminal 24 and is also coupled to a minus 24-volt return line 34. The optical coupler 22 in turn controls a flip flop 28. The flip flop 28 controls a missing pulse detector 30 and a pass transistor 60. A missing pulse detector 30 can reset the flip flop when it detects a missing pulse. The combination of the flip flop 28 and the transistor 60 inhibits the 24-volt low voltage supply to the load switches of the selected signal lights (not shown) thereby preventing the power normally supplied to the signal lights from being supplied to the signal lights while the 24-volt low voltage supply is inhibited.

Figure 2:
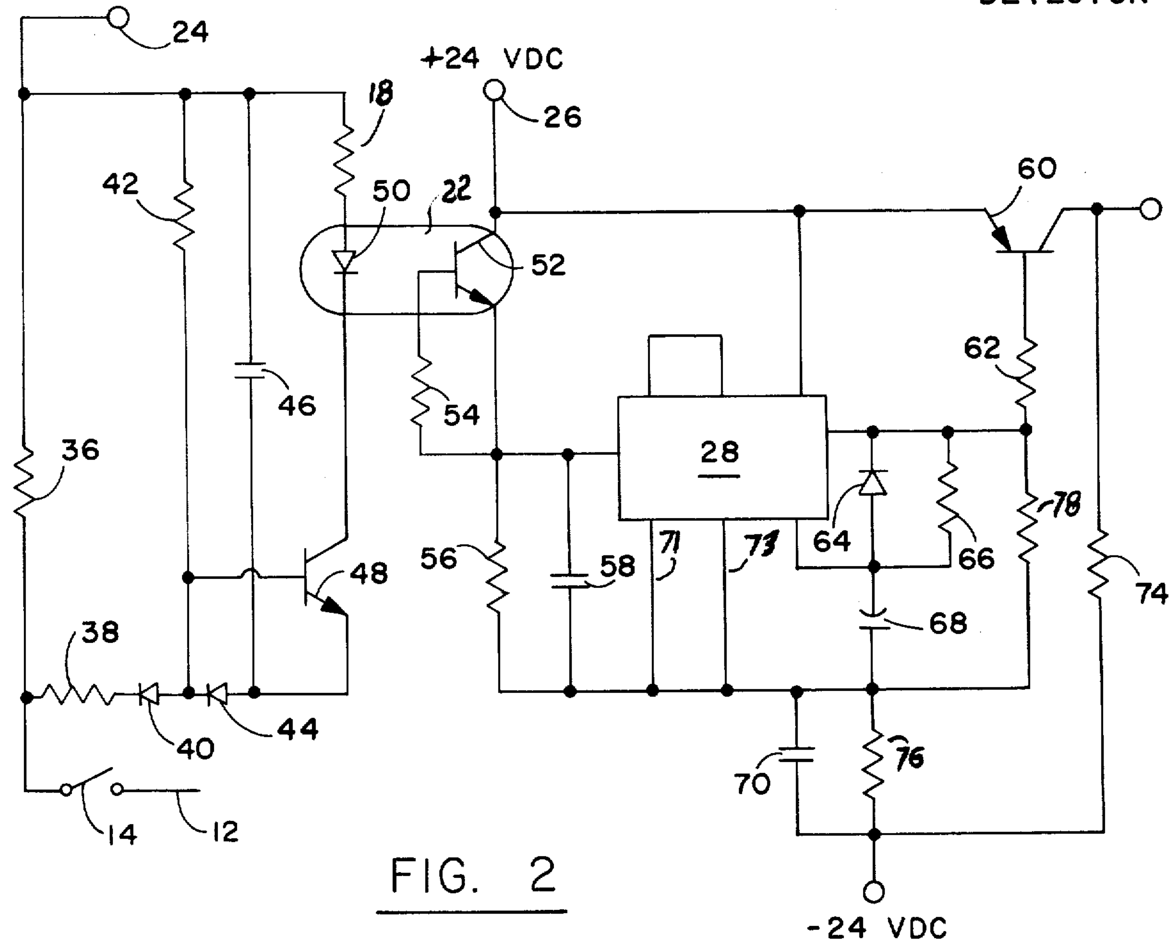

Reference should be made at this time to FIG. 2 which is a circuit diagram of the block diagram of FIG. 1.

The 120-volt ac hotline 12 is coupled through the ac common switch 14 to a leakage resistor 36 and another resistor 38. The 120-volt ac common is coupled to the opposte side of the resistor 36 which is a leakage resistor, a very high resistance value. The 120-volt ac common 24 is also coupled to a terminal of a resistor 42 which acts as part of a zero volt detector, to a terminal of a capacitor 46 which also acts as part of the phase shift network 20, and to a terminal of a very small value resistor 18 which acts as a current limiter.

The power to a traffic signal light (not shown) comes from a load switch, (not shown) which is prior art and is generally on a box on the street corner which is fed by power from the electric company. The load switches are, in the prior art, coupled to the traffic signal lights by a power wire, which is switched on and off by the load switches. This power line switches on and off the 110 volts which illuminate the traffic signal lights. When it is time for the green lamp to turn on the 110 volts will be routed to the green lamp by the load switch and will turn on the green lamp. The load switch itself is controlled by a 24-volt dc power supply which comes from the traffic controller itself, (not shown) the box that sits on the corner and has a power supply in it which is furnished to the load switch. A signal light intensity controller, also called a dimmer 10 according to the present invention interrupts that supply line. That one box on an intersection may have 15 or more load switches controlling various lamps. The ac power goes to each of them. Each of the load switches has built into it a solid state switch which controls one or more lights at the intersection, depending on the information that is fed to it. The information which is fed to the load switch comes from what is called the controller which is a low power device, a microprocessor or similar device. Each of these load switches receives two power supplies, a 110-volt power supply and a 24-volt power volt positive line. Now when that 24 volts is returned to ground through a low power device which is in the controller, that causes the load switch to apply power to the associated lamps.

The preceding and subsequent paragraphs do not relate directly to the present invention, but explain the operation of traffic signal lights. The present dimmer 10 does not interfere in any way with the information input to the load switch. The controller or microprocessor or whatever prior art means is used to control the load switches still returns its signal to ground when it desires power to be applied to the selected lights appropriate to that particular load switch. The present invention controls the 24-volt power supply line which feeds each load switch. The present invention opens the line or prevents that 24-volt power supply from being received at the load switch at appropriate times. When that power is interrupted, the load switch cannot direct 110 volts ac to the traffic signal lights, which accordingly are not illuminated. If the power is interrupted at a very high rate of speed, however, the human eye will not realize that the power is being interrupted, during the conditions under which it is interrupted, but will only see a lesser intensity from the traffic signal light, which will still be sufficient for flicker free illumination. If a traffic signal light is dim in intense sunlight, a human eye may detect a flicker in the traffic signal light, but the traffic signal light would not normally be dimmed in intense sunlight.

The advantage of using the present system to control traffic signal light intensity is that it does not have certain of the problems which the prior art energy savers have. One energy saver clipped off part of the ac wave and would cause a substantial amount of noise. Another one clipped off part of either the negative or positive half of the wave, thereby introducing problems which are not introduced by the present system. The present system permits the reduction of power at a selected time and is compatible with all modern traffic signal light systems. The present system interrupts one ac wave at a selected point which should be for most purposes the zero voltage level and merely starts another wave at the same level one cycle later, or half a cycle later. The present system is capable of reducing traffic light intensity by half or practically any other percentage merely by eliminating a selected number of the 60 cycles per second. The selected number need not be a whole number, but the amount selected should be such that no transients, static, or other interference which can be avoided is introduced into the traffic signal light power system.

Referring back to circuit diagram FIG. 2, the ac power from the switch 14 is transmitted through the resistor 38 and a diode 40 which comprise part of the phase shift net 20. The diode 40 is used as a blocking diode, which permits only half wave current to pass. The half wave current from the blocking diode 40 is transmitted to another blocking diode 44 which is part of the zero volt detector 16, and then is coupled to a terminal of a capacitor 46 which is part of the zero volt detector 16 and to the emitter of the npn transistor 48 which is also part of the zero volt detector 16. The current from the diode 40 alternately turns on and off the npn transistor 48. A collector of the transistor 48 is coupled back through a light emitting diode 50 and a very small current limiting resistor to the 120-volt ac common line. The diode 50 comprises part of the optical coupler 22. The balance of the optical coupler 22 comprises another npn transistor 52 having its collector tied to the plus 24-volt dc input line 26. The collector of transistor 60 is the output of pass transistor 32 in FIG. 1. Transistor 60 conducts when light emitting diode 50 is illuminated.

The emitter of the transistor 52 is coupled back to the flip flop in conjunction with a resistor 56 and a capacitor 58 in parallel. The flip flop 28 controls a transistor 60 which in turn switches on and off the 24-volt power supply to the load switches.

There is and should be a substantial amount of concern about liability if a traffic light fails. This is particularly true for an energy saving device like the present invention, and it may be claimed that the traffic signal lights were not bright enough and thereby caused an accident. This can be caused, even if the dimmer 10 is operating perfectly, and it would be a very serious problem if the lights were dim when they should be bright. Such a malfunction must be prevented and the present circuitry must be failsafe so that when there is a malfunction of the circuit the light will be at its highest intensity. Accordingly, the present invention could be used with a timer which would inhibit the present circuit from having any effect on the traffic signal light except during selected times. The present circuit could also be used with a prior art electric eye which would inhibit the present system except when light received by the electric eye is below the selected intensity. The safest system might use a quartz clock timer with a rechargeable battery such as is used in home thermostats, and would require the activation both in the timer and the light detector to permit the present circuit to operate.

If the flip flop 28 fails for some reason or something in the ac driving of the flip flop somehow becomes defective and the flip flop just stops operating, and is stopped in such a way that the transistor 60 is off, there has been a catastrophic failure of the circuitry of the dimmer 10 which might cause an accident unless we inhibit the output of the dimmer 10. The missing pulse detector 30 which comprises the diode 64, the resistor 66, and the capacitor 68 will detect the failure of the flip flop to change states and will reset the flip flop to its low output state thereby preventing the intensity of the traffic signal lights from being reduced.

Accordingly, a dimmer 10, according to the present invention, is synchronized to the ac power line and applies plus 24 volts dc current to all the load switches in a control cabinet as uninterrupted current during the daylight hours and only a selected percentage of the time at selected times such as night time. A circuit as described herein turns on the ac power about 500 microseconds before the ac zero-voltage crossing, and turns off the dc currents about 500 microseconds before the ac zero-voltage crossing. Accordingly, the on and off cycles of the ac are each one full ac period apart and avoid transformer heating caused by proir art devices. It is thought that a dimmer 10 according to the present invention dissipates nearly the theoretical minimum amount of power, thereby using slight amounts of power and reducing system noise, static, etcetera. A dimmer 10 according to the present invention is installed in series with the plus 24-volt dc supply to the load switches and connect to the ac line for synchronization. A system test at a street intersection in ElCajon, Calif., has indicated that, as claimed in the present application, the circuit does perform as claimed herein. Referring back to FIG. 2, for additional timing, when S-14 is closed, current flows through the diodes 40, 44 on a negative half-cycle to charge the capacitor 46. During the charging half-cycle, the diode 44 keeps transistor 48 back biased in the off state. When the ac voltage goes through zero to the positive half-cycle, transistor 48 is turned on by the current from the capacitor 46 through resistor 42. This base current saturates the transistor for 500 to 600 microseconds until the charge on the capacitor is dissipated. During this period current flows through the light emitting diode 50 part of the optical coupler 22 and is limited by the small current limiter resistor 18 to about 20 milliamps peak. This is sufficient to operate the optical coupler 22 reliably for a short period of time.

The actual time of this current pulse is determined by the ac voltage zero crossing which is advanced slightly in phase by the resistor 38 in series with the capacitor 46. This advance of about 500 or 600 microseconds results in providing plus 24 volts dc current to the load switches ahead of any built-in zero volt switch inhibit circuitry such as found in a substantial number of these prior art load switches.

When this brief current pulse passes through the diode 50 part of the optical coupler 22, it causes the coupled npn transistor 52 to saturate. This raises the voltage to the clock input of the flip flop 28, thereby switching the output state of the flip flop 28, which is coupled to resistor 62. Each time a pulse appears at the clock input of the flip flop 28, the output changes state. Since a pulse is received on each positive going ac half-cycle, the flip flop output will be high for one full ac cycle and low for one full ac cycle. This gives us a simple system for cutting light output generated by each load switch by 50 percent without introducing noise or half-cycle transformer heating. The set input 71 of the flip flop 28 is disabled by being connected to a disabling pin 73, if the flip flop circuit 28 comprises more than one flip flop as it frequently does on typical integrated circuits. Accordingly, the lines 71, 73 will keep the unwanted flip flops of the integrated circuits, if any, passive. One of the lines 71 or 73 is used as a ground return line for the flip flop which is active if there are more than one flip flops in the flip flop circuitry.

The capacitor 70 is parallel with the resistor 76 and are coupled to the minus 24 vdc to form a decoupling network for voltage dropping purposes. The diode 64, resistor 66, capacitor 68 system is a missing pulse detector which resets the flip flop 28 to a low output state if a missing pulse is detected, thereby preventing the transistor 60 from inhibiting power to the load switches, thereby maintaining the traffic signal lights in their maximum illumination state in case of malfunction in the dimmer circuit 10.

A particular example of the invention has been described herein. Other examples will be obvious to those skilled in the art. The invention is limited only by the following claims:

I claim:

1. A circuit capable of reducing power consumed by all of the signal lights at a street intersection, comprising:

activating switching means to activate the circuit;

timing current interruption means turned on by the activating means, which timing current interruption means inhibit the 24 volt low voltage supply to load switches of the selected signal lights, thereby preventing the power normally supplied to the signal lights from being supplied to the signal lights while the 24 volt low voltage supply as inhibited, wherein the activating switching means comprises at least one of the following:

a timer, a light intensity detector, signals from signal means coupled to the timing current interruption means to selectively activate and deactivate the timing current interruption means.

2. The invention of claim 1 further including missing pulse detector means coupled to the timing current interruption means to prevent the timing current interruption means from preventing power from being supplied to the signal lights during substantially all situations where at least one element of the timing current interruption means has failed.

3. The invention of claim 2 wherein the timing current interruption means comprises an ac hotline coupled through a first diode to the base of an npn transistor and through a second diode to the emitter of the transistor and to a capacitor, the discharge of which capacitor causes the transistor to conduct when the diodes are not conducting because the ac has gone through zero to the positive half cycle, the transistor conducting current through a light emitting diode in an optical coupler which causes a coupled npn transistor to saturate, which raises the voltage to the clock input of a flip flop thereby switching the output state of the flip flop and causing a pass transistor to switch between conducting and nonconducting states.

4. The invention of claim 3 wherein the conduction of current through the light emitting diode causes the pass transistor to conduct on alternate cycles of ac 60 cycle input voltage, a signal out of the collector of the pass transistor which cuts off the 24-volt power supply feeding at least one load switch which causes the load switch to cut off ac input power to at least one traffic signal light thereby preventing illumination of the traffic light while the pass transistor is not conducting.

5. The invention of claim 4 wherein the missing pulse detector comprises a storage capacitor having a first plate coupled in series to a first side of a diode and resistor in parallel, the second plate of the capacitor being coupled to minus 24 volts dc through another capacitor and resistor in parallel, and the junction of the capacitor, resistor and diode being coupled to the flip flop to reset the flip flop in the absence of a switch in state of the flip flop during the charging time of the capacitor, which resetting of the flip flop ensures the conduction of the pass transistor which in turn prevents the inhibiting of the 24-volt dc input to the load switches coupled to the pass transistor, and the current pulse from the capacitor which causes the light emitting diode to conduct being advanced about 500 microseconds by a resistor between the switch and the first diode.

* * * * *